United States Patent [19]

Izadinia et al.

[11] Patent Number: 4,904,960
[45] Date of Patent: Feb. 27, 1990

[54] PRECISION CMOS OSCILLATOR CIRCUIT

[75] Inventors: Mansour Izadinia, Santa Clara; Tamas Szepesi, San Jose, both of Calif.

[73] Assignee: National Semiconductor Corporation, Santa Clara, Calif.

[21] Appl. No.: 335,614

[22] Filed: Apr. 10, 1989

[51] Int. Cl.[4] ............................................. H03K 3/00
[52] U.S. Cl. ..................................... 331/111; 331/143
[58] Field of Search ................... 331/111, 113 R, 143, 331/144

[56] References Cited

U.S. PATENT DOCUMENTS 4,521,748 6/1985 Ryczek et al. ................. 331/111 X Primary Examiner—Eugene R. LaRoche
Assistant Examiner—Robert J. Pascal
Attorney, Agent, or Firm—Gail W. Woodward; Lee Patch; Michael A. Glenn

[57] ABSTRACT

A CMOS relaxation oscillator is disclosed employing a pair of capacitors and individual charging means. A noninverting amplifier comprising two cascaded inverters is provided with a transmission gate input circuit that alternately switches the amplifier input between the two capacitors. A pair of switches coupled respectively across the capacitors alternately discharge them. The resulting oscillator has a frequency determined by the capacitor charging periods. Accordingly, the frequency and duty cycle can be predetermined as desired. The circuit can also be made either power supply tunable or power supply independent.

7 Claims, 1 Drawing Sheet

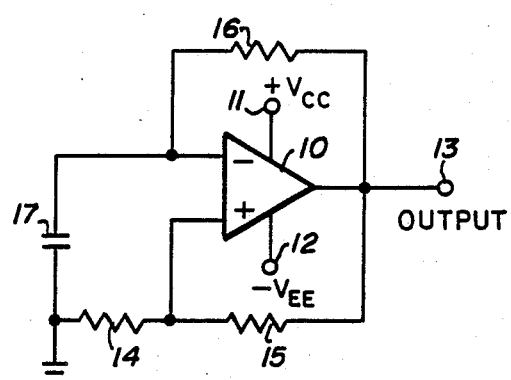
Fig_1 (PRIOR ART)
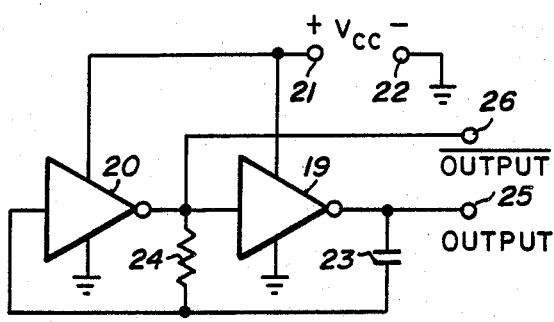
Fig_2 (PRIOR ART)
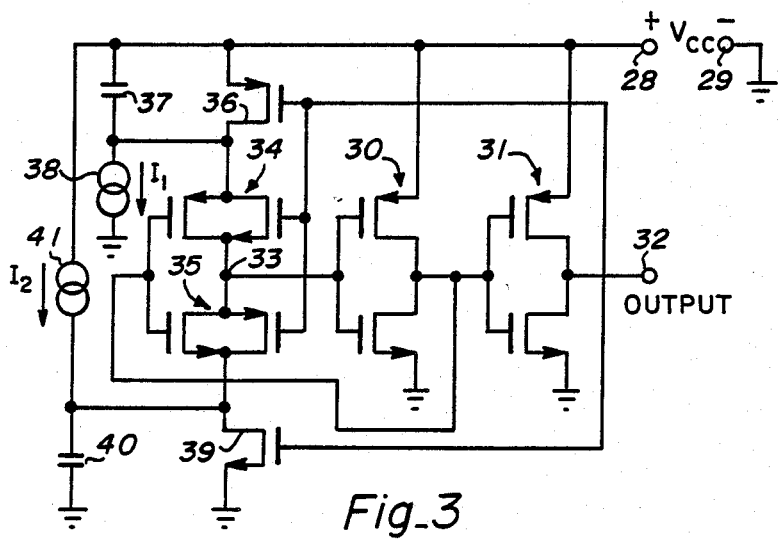
Fig_3
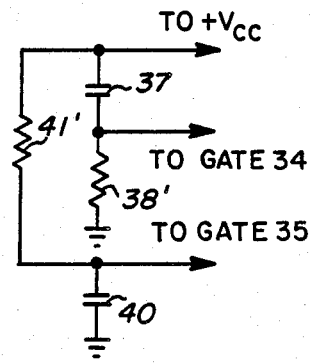
Fig_5
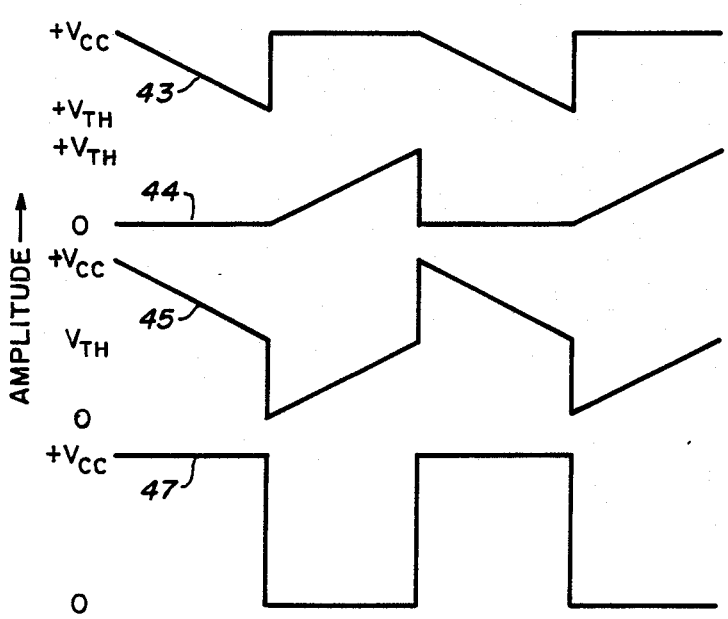
Fig_4
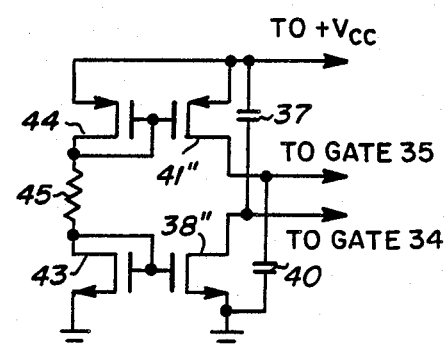
Fig_6

PRECISION CMOS OSCILLATOR CIRCUIT

BACKGROUND OF THE INVENTION

Relaxation oscillators are often used in integrated circuit (IC) design. They are defined as circuits that alternately charge and discharge a timing capacitor between two internally determined threshold voltages. A periodic output voltage waveform is produced to have a frequency that is inversely proportional to the timing capacitor value and proportional to the charging current.

FIG. 1 shows a well known prior art relaxation oscillator. An operational amplifier (op amp) 10 is operated from a split power supply connected + to $V_{CC}$ rail 11 and − to $V_{EE}$ rail 12. The ground potential is substantially midway between $+V_{CC}$ and $-V_{EE}$. Output terminal 13 develops a square wave that swings between close to $+V_{CC}$ and $-V_{EE}$. Resistors 14 and 15 form a voltage divider connected to output terminal 13. The tap is connected to the noninverting input of op-amp 10. This feedback is positive so that the circuit is oscillatory. Resistor 16 and capacitor 17 form an integrator connected between output terminal 13 and the inverting op-amp input. When the output is high resistors 14 and 15 establish a positive threshold potential at the noninverting op-amp input. Capacitor 17 will then charge through resistor 16 until the threshold is exceeded at which time the output will go negative. Now resistors 14 and 15 will establish a negative threshold at the inverting input. Capacitor 17 will discharge and then charge towards the negative potential until the negative threshold is reached. Thus, the capacitor will charge positively and negatively between the threshold levels established sequentially by the resistor divider. The oscillator frequency will be determined by the capacitor value, the values of resistors 14–16 and the total supply voltage. In an alternative construction resistor 16 can be replaced by a constant current source.

FIG. 2 shows a relaxation oscillator circuit that operates from a single supply. A pair of cascaded inverters 19 and 20 are operated from a single power supply connected + to $V_{CC}$ terminal 21 and − to ground terminal 22. A timing capacitor 23 is connected between the output of inverter 19 and the input of inverter 20 thus creating oscillatory feedback. Timing resistor 24 is coupled between the input and output of inverter 20.

When terminal 25 is high and terminal 26 is low, capacitor 23 will charge through resistor 24 until the threshold of inverter 19 is reached at which time terminal 25 will switch low and terminal 26 will switch high. Then capacitor 23 will charge in the other direction through resistor 24 until the threshold of inverter 20 is reached at which time the circuit will again switch. The outputs at terminals 25 and 26 are complementary square waves having amplitudes that swing between close to ground and $+V_{CC}$. The frequency is determined primarily by capacitor 23 and resistor 24 and the threshold of inverter 20. As was the case for the FIG. 1 circuit, timing resistor 24 can be replaced with a constant current source.

In both of the above prior art circuits a square wave output is produced and the symmetry of the circuit results in a close to 50% duty cycle. Other prior art relaxation oscillator circuits operate to control the capacitor charge and discharge currents separately so that other duty cycle values can be achieved, but these circuits are typically subject to fabrication variables and display temperature and fabrication process sensitivity that is undesirable.

SUMMARY OF THE INVENTION

It is an object of the invention to provide a CMOS oscillator circuit in which the duty cycle can be predetermined over a wide range.

It is another object of the invention to provide a CMOS oscillator in which the duty cycle can be predetermined and in which temperature response is minimized.

It is a still further object of the invention to provide a CMOS oscillator circuit that employs a single power supply and can be made responsive to or independent of power supply voltage as desired.

These and other objects are achieved in the following manner. Two CMOS inverters are cascaded together to produce a noninverting amplifier. A pair of capacitors are coupled so that one charges with respect to the negative supply terminal and the other charges with respect to the positive supply terminal. Each capacitor has a switch transistor coupled in parallel and a charging current supplied by either a resistor or a constant current source. The buffer input is connected to a pair of transmission gates that are switched by the complementary signals at the input and output terminals of the second inverter. The same complementary signals operate the switches connected across the capacitors. The transmission gates switch the buffer input alternately between the two capacitors in such a manner that the capacitor that is connected has its shunt switch turned off. Thus, that capacitor is charged to the point where its potential reaches the input inverter trip point. When the trip point is reached the circuit switches and the other capacitor is charged. The capacitors are charged so that the time-constant is relatively long and when one capacitor is being charged the other one is discharged relatively rapidly through its shunt switch. If the two capacitors are of equal value and their charging paths pass equal currents the oscillator duty cycle will be 50%. However, by varying the relative sizes of the capacitors, and/or their charging currents, virtually any duty cycle will be obtainable. If the charging current is varied with the supply potential, the oscillator frequency can be made independent of supply voltage. If the charging current is made independent of supply voltage the frequency can be modulated as a function of supply voltage.

BRIEF DESCRIPTION OF THE DRAWING

FIG. 1 is a block-schematic diagram of a prior art oscillator circuit.

FIG. 2 is a block-schematic diagram of another prior art oscillator circuit.

FIG. 3 is a schematic diagram of the circuit of the invention.

FIG. 4 is a graph showing the waveforms of the various nodes of FIG. 3.

FIG. 5 is a schematic diagram of a circuit for making the capacitor charging current a function of the supply voltage.

FIG. 6 is a schematic diagram of an alternative circuit for making the capacitor charging current a function of the supply voltage.

DESCRIPTION OF THE INVENTION

In the circuit of FIG. 3, a single power supply source is connected + to $V_{CC}$ terminal 28 and − to ground terminal 29. Two inverters 30 and 31 are coupled in cascade to operate as a high gain noninverting amplifier driving output terminal 32. The input to inverter 31 is the complement of the signal at terminal 32. Each inverter stage has a trip potential ($V_{TR}$) which is defined as that potential that exists when the inverter output is shorted to its input. Typically, $V_{TR}$ is a function of the relative size of the N channel and P channel transistors and is commonly made close to $V_{CC}/2$. As a practical matter it is relatively easy to fabricate CMOS circuits so that $V_{TR}$ is held to between 40% and 60% of $V_{CC}$. CMOS transistors are typically enhancement type devices and have threshold values ($V_{TN}$ for N channel devices and $V_{TP}$ for P channel devices) that are relatively low and controlled. For an inverter to operate effectively the applied supply potential should exceed the sum of thresholds. $V_{TN}+V_{TP}<V_{CC}$.

A pair of transmission gates 34 and 35 are operated complementarily to function as a single pole double throw switch that acts to switch node 33 between timing capacitors 37 and 40. Transmission gates 34 and 35 are switched by the signals at the input and output of inverter 31. The switching is arranged so that only one of the transmission gates is conductive at a time. For example, when output terminal 32 is high gate 3 will be nonconductive or off and gate 34 will be conductive or on. When gate 34 is on, transistor 36 will be off and capacitor 37 will be coupled to the input of inverter 30 (node 33). Assuming that capacitor 37 was previously discharged, constant current source 38, which passes $I_1$, will charge capacitor 37 and node 33 which was previously high will fall in potential. The fall in potential at node 33 will continue until inverter 30 reaches its $V_{TR}$. At this point the input to inverter 31 will go from low to high and inverter 31 will drive output terminal 32 low.

Under these conditions it can be seen that transmission gate 34 will be turned off and transistor 36 will be turned on. Also, transmission gate 35 will turn on and transistor 39 will be turned off. At this point capacitor 40 is coupled to node 33 which will rise as current source 41 conducts $I_2$ to charge capacitor 40. This charging will continue until node 33 rises to the $V_{TR}$ of inverter 30, at which point the circuit will again switch.

Thus, the circuit will oscillate as capacitors 37 and 40 alternately charge. The frequency is determined primarily by the values of capacitors 37 and 40 along with the values of $I_1$ and $I_2$ and the supply voltage ($V_{CC}$). If the capacitors are of equal value and if $I_1$ and $I_2$ are the same the oscillation will have a duty cycle close to 50%. Clearly, by changing these values the duty cycle can be varied over very wide limits. The circuit is relatively insensitive to fabrication process variations. When small capacitors and charging currents are employed, a relatively high frequency operation is available. Finally, the circuit of FIG. 3 requires very little semiconductor die area. It can be fabricated into an area less than about 0.065 square millimeter.

FIG. 4 is a graph showing the voltage waveforms of the circuit of FIG. 2. Waveform 43 is the voltage at the drain of P channel transistor 36 and represents the potential at lower plate of capacitor 37. Waveform 44 is the voltage across capacitor 40. Waveform 45 is the voltage at node 33. Waveform 47 is the voltage at output terminal 32. The waveform at the input of inverter 31 is the complement of waveform 47. Note that waveform 47 and its complement represent substantially rail to rail amplitude and show digital activity. For the conditions shown it is also clear that since $V_{TR}$ is close to $V_{CC}/2$, the frequency of oscillation will vary inversely with $V_{CC}$. Thus, the circuit is supply voltage tunable.

If the circuit of FIG. 5 is employed it can be seen that constant current sources 38 and 41 have been replaced with resistors 38' and 41'. This means that $I_1$ and $I_2$ are related to $V_{CC}$ and will be proportional thereto. This will have a stabilizing effect that will offset the $V_{CC}$ tunability. So long as $V_{CC}$ is substantially larger than $V_{TN}+V_{TP}$ the frequency will be substantially independent of supply voltage. It is to be understood that if the FIG. 5 circuit is employed, the ramps shown in waveforms 43–45 of FIG. 4 will no longer be linear as shown. They will have the usual exponential curvature associated with R-C charging.

FIG. 6 shows another circuit alternative that is not frequency tunable by $V_{CC}$. Here the constant current sources 38 and 41 are achieved by transistors 38'' and 41'' which are connected as current mirrors to transistors 43 and 44. Resistor 45 passes a current that is proportional to $V_{CC}$ when it is substantially greater than $V_{TN}+V_{TP}$. Therefore, $I_1$ and $I_2$ are constant and proportional to $V_{CC}$. Thus, the circuit is frequency stable with respect to supply voltage. However, unlike the operation of FIG. 5, the waveforms of FIG. 4 will result as shown.

It is to be understood that while the preferred embodiment of the invention has been described in terms of CMOS technology, other approaches can be used. For example, bipolar transistor technology could be employed. In such a case the P channel CMOS devices could be replaced by PNP transistors and, where N channel CMOS transistors are shown, an NPN transistor could be used.

The invention has been described and its operation detailed. When a person skilled in the art reads the foregoing description, alternatives and equivalents, within the spirit and intent of the invention, will be apparent. Accordingly, it is intended that the scope of the invention be limited only by the following claims.

We claim:

1. An oscillator circuit operating from first and second power supply terminals connectable to a source of operating potential, said circuit comprising:

first and second capacitors, each having a first terminal connected to one of said supply terminals and having a second terminal coupled in series through current conducting means to the opposite of said supply terminals;

first and second switching means comprising transistors having their controlled conduction electrodes connected across said first and second capacitors respectively thereby creating two parallel connected capacitor and switching transistor combinations whereby said switching transistors can be turned on by their control electrodes to discharge the parallel connected capacitor; and means for alternately turning said switching means on thereby discharging said capacitors alternately whereby said capacitors charge alternately as a result of said current conducting means and said charge establish a timing period that determines the frequency of oscillation of said circuit.

2. The oscillator circuit of claim 1 wherein said means for alternately turning said first and second switching means on comprises:
   first and second inverters coupled in cascade with the output of said first inverter coupled to the input of said second inverter; and
   means for alternately coupling the input of said first inverter to said first and second capacitors.

3. The oscillator circuit of claim 2 wherein said first and second switching means comprise complementary transistors having their control electrodes commonly coupled to the output of said second inverter.

4. The oscillator circuit of claim 3 wherein said means for alternately coupling the input of said first inverter to said first and second capacitors comprises a pair of transmission gates having outputs commonly coupled to the input of said first inverter, inputs separately coupled to said capacitors and control electrodes coupled to be operated complementarily by said second inverter.

5. The oscillator circuit of claim 3 wherein said current conducting means is a constant current source whereby the frequency of said oscillator circuit is a function of the potential connected between said power supply terminals.

6. The oscillator circuit of claim 3 wherein said current conducting means provides a current that is proportional to said potential connected between said power supply terminal and said frequency of oscillation is independent of said power supply voltage.

7. The oscillator circuit of claim 6 wherein said current conducting means comprise resistive means.

* * * * *